United States Patent
Huang et al.

(10) Patent No.: US 10,475,680 B2
(45) Date of Patent: Nov. 12, 2019

(54) WAFER SHIPPING BOX AND A LOWER RETAINING MEMBER THEREOF

(71) Applicant: Chung King Enterprise Co., Ltd., Taoyuan (TW)

(72) Inventors: Shih-Chin Huang, Taoyuan (TW); Xiang-Ying Chen, Taoyuan (TW); Yen-Fang Chen, Taoyuan (TW); Chang-Wei Chen, Taoyuan (TW)

(73) Assignee: CHUNG KING ENTERPRISE CO., LTD., Taoyuan (TW)

( * ) Notice: Subject to any disclaimer, the term of this patent is extended or adjusted under 35 U.S.C. 154(b) by 0 days.

(21) Appl. No.: 16/116,021

(22) Filed: Aug. 29, 2018

(65) Prior Publication Data

US 2019/0067044 A1  Feb. 28, 2019

(30) Foreign Application Priority Data

Aug. 31, 2017  (TW) .............................. 106212907 U

(51) Int. Cl.
*H01L 21/673* (2006.01)

(52) U.S. Cl.
CPC .... *H01L 21/6732* (2013.01); *H01L 21/67383* (2013.01); *H01L 21/67386* (2013.01); *H01L 21/67373* (2013.01)

(58) Field of Classification Search
USPC .................................................. 206/710, 711
See application file for complete search history.

(56) References Cited

U.S. PATENT DOCUMENTS

| | | | | |
|---|---|---|---|---|
| 8,453,841 B1 * | 6/2013 | James | ............... | H01L 21/67326 206/308.1 |
| 2010/0072107 A1 * | 3/2010 | Mimura | ............ | H01L 21/67369 206/711 |
| 2010/0307957 A1 * | 12/2010 | Wiseman | .......... | H01L 21/67369 206/711 |
| 2012/0043254 A1 * | 2/2012 | Inoue | ................ | H01L 21/67386 206/711 |
| 2015/0068948 A1 * | 3/2015 | Hong | .................. | H01L 21/6732 206/711 |
| 2015/0068949 A1 * | 3/2015 | Raschke | ........... | H01L 21/67369 206/711 |

* cited by examiner

*Primary Examiner* — Jacob K Ackun
(74) *Attorney, Agent, or Firm* — Hamre, Schumann, Mueller & Larson, P.C.

(57) ABSTRACT

A wafer shipping box includes a case and a positioning unit. The case includes a base, a cover, and a receiving space defined by the base and the cover. The positioning unit is disposed in the receiving space and includes a lower retaining member connected to the base, an upper retaining member connected to the cover, and a cassette disposed therebetween. The cassette includes two upright holding walls spaced apart from each other, each of which has a plurality of lateral confining slots aligned in a front-rear direction. The lower retaining member is formed with a plurality of lower confining slots, each of which is defined by two slot walls interconnected at bottom ends thereof to form a slot bottom. The slot bottoms are respectively misaligned from central positions of the lateral confining slots along the front-rear direction.

17 Claims, 7 Drawing Sheets

WAFER SHIPPING BOX AND A LOWER RETAINING MEMBER THEREOF

CROSS-REFERENCE TO RELATED APPLICATION

This application claims priority of Taiwanese Patent Application No. 106212907, filed on Aug. 31, 2017.

FIELD

The disclosure relates to a container, and more particularly to a wafer shipping box and a lower retaining member thereof.

BACKGROUND

The thickness of a wafer has become thinner over the course of semiconductor development, going from a thickness of 625 micrometers ($\mu m$) down to a thickness as low as 100 $\mu m$.

A conventional wafer shipping box includes a base, a cover, an lower pad that is connected to the base, an upper pad that is connected to the cover, and a wafer cassette. The wafer cassette has a plurality of confining slots that are spaced apart from each other for holding wafers, each of which is further confined from movement by the upper and lower pads. As the structure and size of each of the elements of the wafer shipping box are required to be compatible with various conventional automation equipment, the width of each of the confining slots of the wafer cassette is also required to correspond to thickness of a standard-sized wafer. However, with advanced design of the thinner wafer, the width of each of the confining slots has become too large to properly hold this type of wafer securely, possibly leaving much larger gap that may easily cause the wafer to misalign and to be prone to exterior damage.

To address the abovementioned issues, each of the upper and lower pads is designed to be formed with a plurality of V-shaped grooves, each of which is adapted to receive a corresponding one of the wafers and to restrict movement of the corresponding one of the wafers through confinement of upper and lower edges thereof. However, when the cover of the conventional wafer shipping box is removed, the thinner wafers would still lean toward and collide with either sides of their respective confining slots which are wide relative to the thickness of the thinner wafers, possibly become attached to neighboring wafers to make retrieval and placement of the wafers difficult. In the most severe scenario, the wafers may be damaged or break apart.

SUMMARY

Therefore, an object of the disclosure is to provide a wafer shipping box that can alleviate at least one of the drawbacks associated with the abovementioned prior art.

Accordingly, the wafer shipping box includes a case and a positioning unit.

The case includes a base, a cover detachably connected to the base, and a receiving space defined by the base and the cover.

The positioning unit is disposed in the receiving space and includes a lower retaining member that is connected to the base, an upper retaining member that is connected to the cover, and a cassette that is disposed between the upper and lower retaining members. The cassette includes two upright holding walls that are spaced apart in a left-right direction and opposite to each other. Each of the holding walls has a plurality of lateral confining slots aligned in a front-rear direction. Each of the lateral confining slots extends in a top-down direction and has a top end opening and a bottom end opening. The upper retaining member is formed with a plurality of upper confining slots that respectively correspond in position to the lateral confining slots of the holding walls. The lower retaining member is formed with a plurality of lower confining slots that respectively correspond in position to the lateral confining slots of the holding walls. Each of the lower confining slots is defined by two slot walls that are interconnected at bottom ends thereof to form a slot bottom, and that have upper ends spaced apart from each other. The slot bottoms of the lower confining slots are respectively misaligned from central positions of the lateral confining slots of the holding walls along the front-rear direction.

Another object of the disclosure is to provide a lower retaining member for a wafer shipping box. The wafer shipping box includes a base, a cover detachably connected to the base, a receiving space defined by the base and the cover, and a cassette disposed in the receiving space and including two holding walls that are spaced apart in a left-right direction and opposite to each other. Each of the holding walls has a plurality of lateral confining slots aligned in a front-rear direction. Each of the lateral confining slots extends in a top-down direction and has a top end opening and a bottom end opening.

The lower retaining member is formed with a plurality of lower confining slots that respectively correspond in position to the lateral confining slots of the holding walls. Each of the lower confining slots is defined by two slot walls that are connected at bottom ends thereof to form a slot bottom, and that have upper ends spaced apart from each other. The slot bottoms of the lower confining slots are respectively misaligned from central positions of the lateral confining slots of the holding walls along the front-rear direction.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
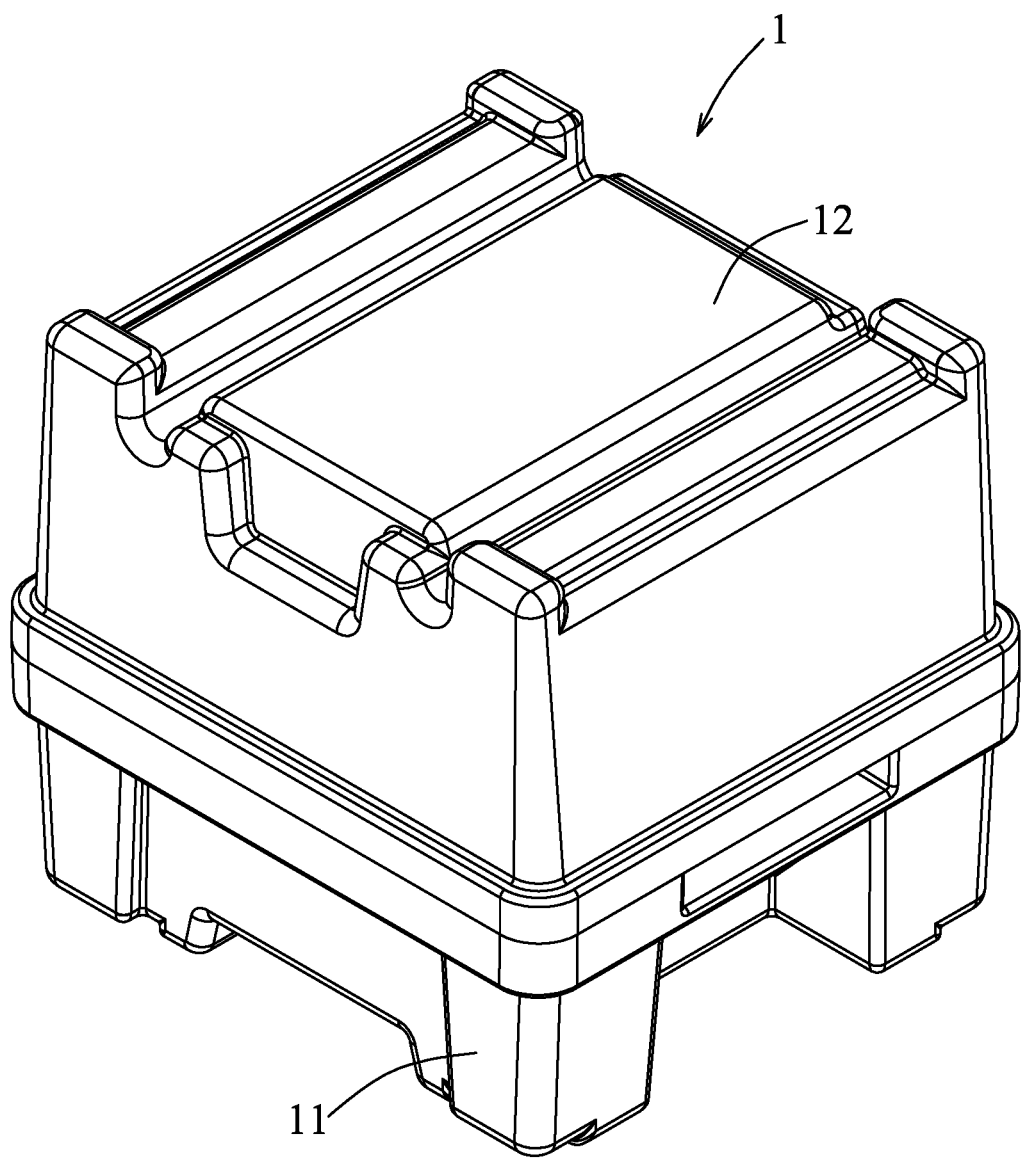
FIG. 1 is a perspective view of an embodiment of a wafer shipping box according to the present disclosure.
Figure 2:
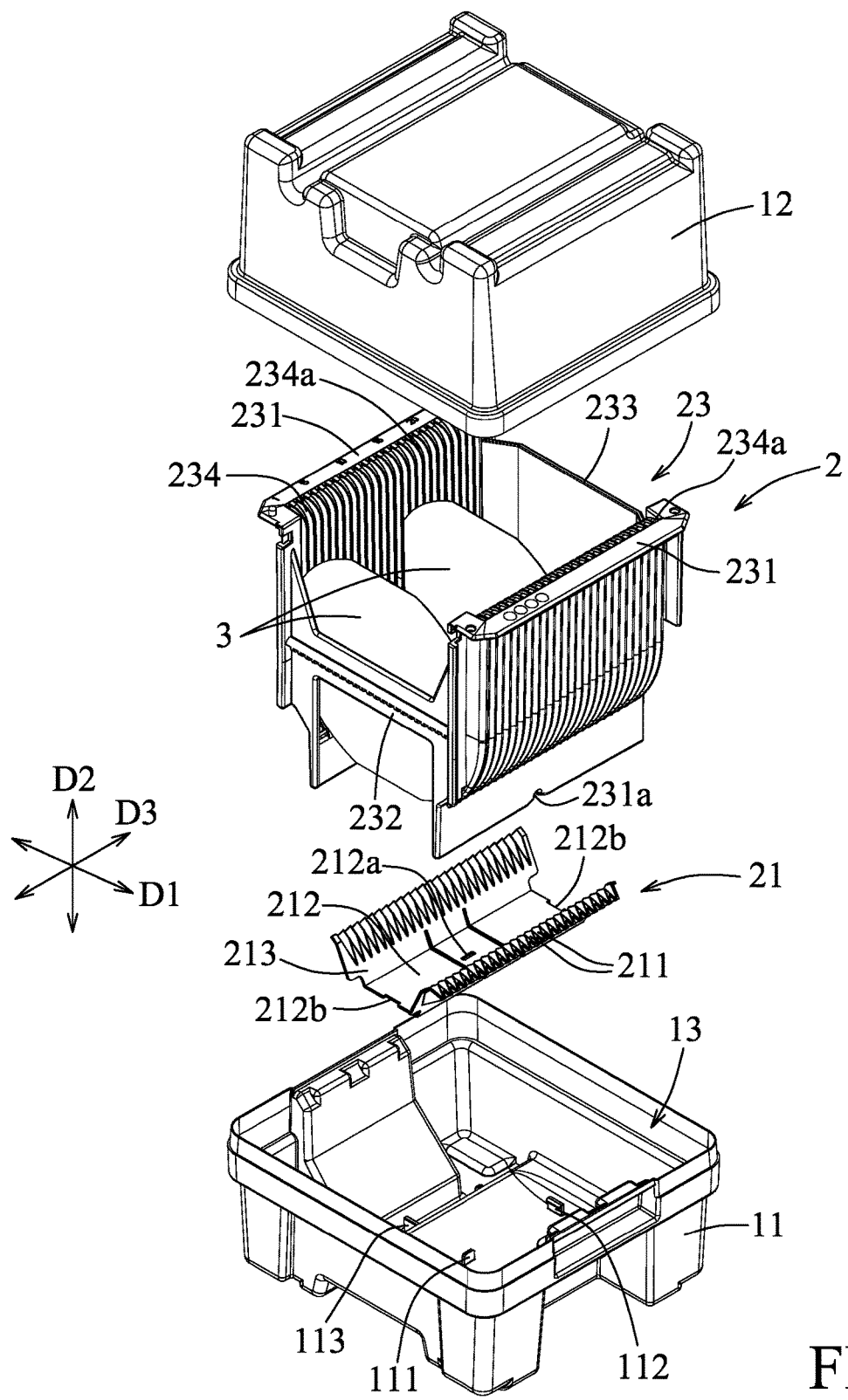
FIG. 2 is an exploded perspective view of the embodiment.

Referring to FIGS. 1 to 4 and 6, an embodiment of a wafer shipping box of this disclosure includes a case 1 and a positioning unit 2. The case 1 includes a base 11, a cover 12 that is detachably connected to the base 11, and a receiving space 13 defined by the base 11 and the cover 12. The positioning unit 2 is disposed in the receiving space 13, and includes a lower retaining member 21 that is connected to the base 11, an upper retaining member 22 that is connected to the cover 12, and a cassette 23 that is disposed between the upper and lower retaining members 22, 21.

The cassette 23 includes two upright holding walls 231 that are spaced apart and opposite to each other in a left-right direction (D1), an H-shaped front wall 232 that is connected to front ends of the holding walls 231, and a rear wall 233 that is connected to rear ends of the holding walls 231 and that is opposite to the front wall 232. Each of the holding walls 231 has a plurality of lateral confining slots 234 aligned in a front-rear direction (D3). The lateral confining slots 234 of one of the holding walls 231 correspond in position to the lateral confining slots 234 of the other one of the holding walls 231 along the left-right direction (D1). Each of the lateral confining slots 234 extends in a top-down direction (D2) and has a top end opening 234a and a bottom end opening 234b.

The upper retaining member 22 is formed with a plurality of upper confining slots 221 that respectively correspond in position to the lateral confining slots 234 of the holding walls 231, and the lower retaining member 21 is formed with a plurality of lower confining slots 211 that respectively correspond in position to the lateral confining slots 234 of the holding walls 231. Also referring to FIG. 7, when a wafer 3 is placed inside one of the lateral confining slots 234 of the cassette 23, a top edge and a bottom edge of the wafer 3 respectively protrude from the top end opening 234a and the bottom end opening 234b. The lateral, upper and lower confining slots 234, 221, 211 correspond in position to collectively hold a plurality of the wafers 3.

The lower retaining member 21 includes a base portion 212 and two supporting portions 213 that are respectively connected to opposite sides of the base portion 212 in the left-right direction (D1). The lower confining slots 211 are formed on top ends of the supporting portions 213 of the lower retaining member 21 and extend upwardly away from each other.

In this embodiment, the two supporting portions 213 are inclined upwardly away from each other as well, such that the supporting portions 213 may flexibly bend along with the lower confining slots 211 downwardly and outwardly to provide buffer for placement of the wafers 3 therein. Also in this embodiment, the base portion 212 defines a through groove 212a near its center, and is formed with two positioning notches 212b, one on its front side and one on its rear side.

The base 11 is formed with a first protrusion member 111 that may extend though the through groove 212a of the base portion 212 of lower retaining member 21 and two resilient hooks 112 that respectively buckle with the respective positioning notches 212b of the base portion 212 of lower retaining member 21 to fix the lower retaining member 21. The base 11 is further formed with two second protrusion members 113 to position the cassette 23 thereon. Each of the holding walls 231 of the cassette 23 is formed with a positioning notch 231a that is engaged with a corresponding one of the second protrusion members 113.

Figure 3:
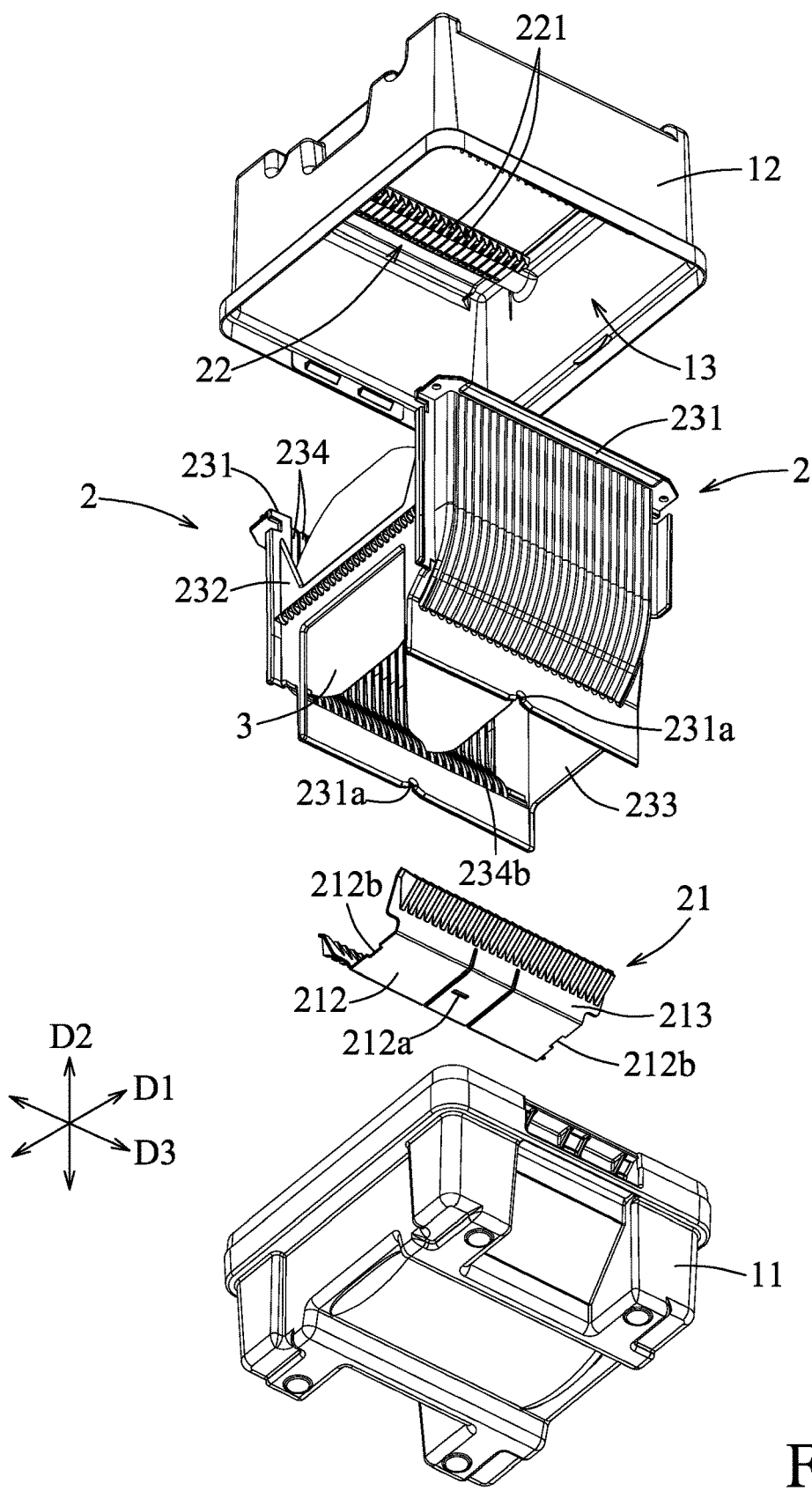
FIG. 3 is another exploded perspective view of the embodiment.
Figure 4:
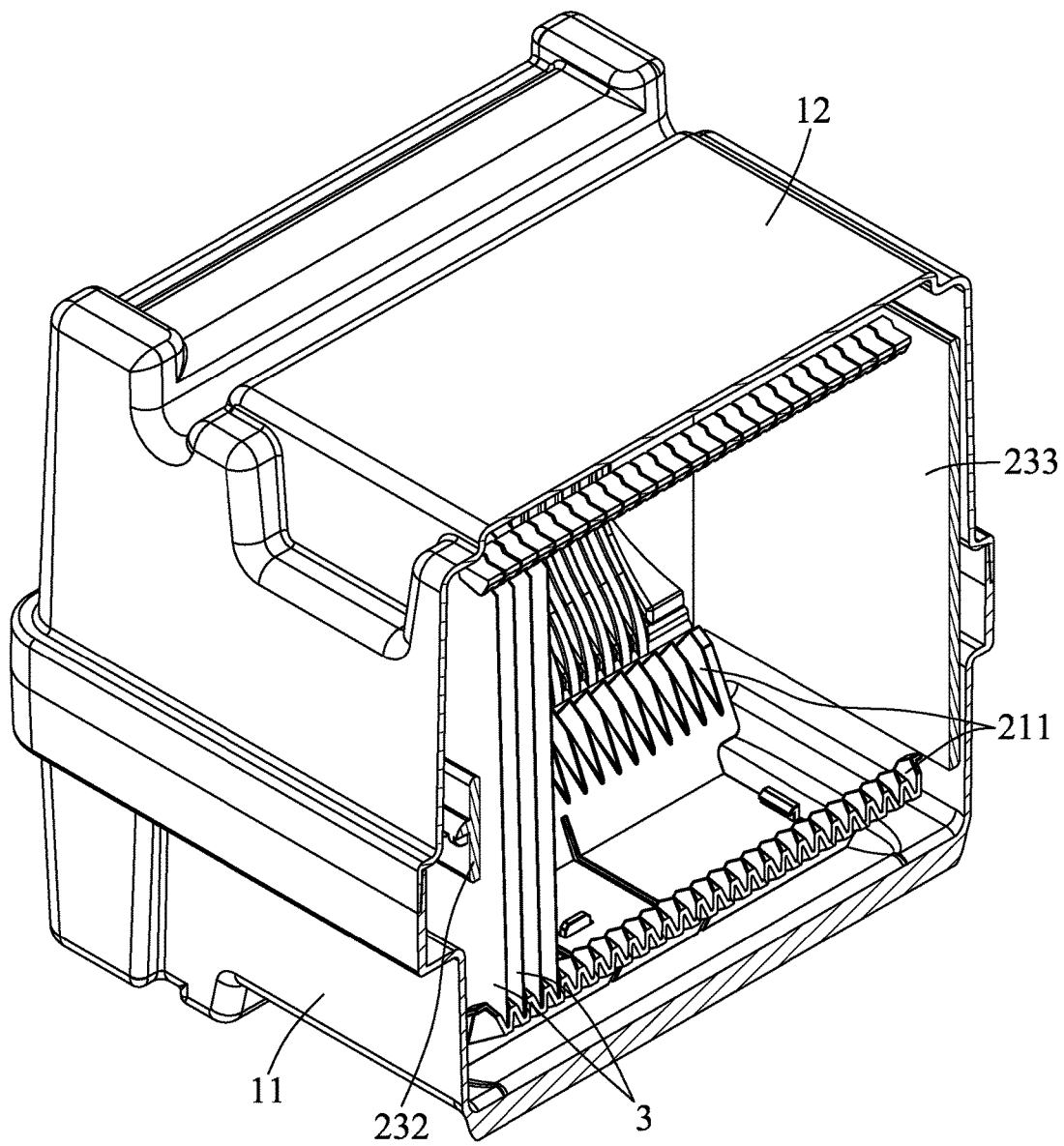
FIG. 4 is a sectional perspective view of the embodiment.

The upper retaining member 22 and the cover 12 may be connected as separate pieces, or as exemplified in this embodiment, they are formed as one piece. The upper retaining member 22 is formed on the cover 12 in two parts, spaced apart from left to right. Referring to FIG. 3, the upper retaining member 22 is only partially seen in this perspective view.

Figure 5:
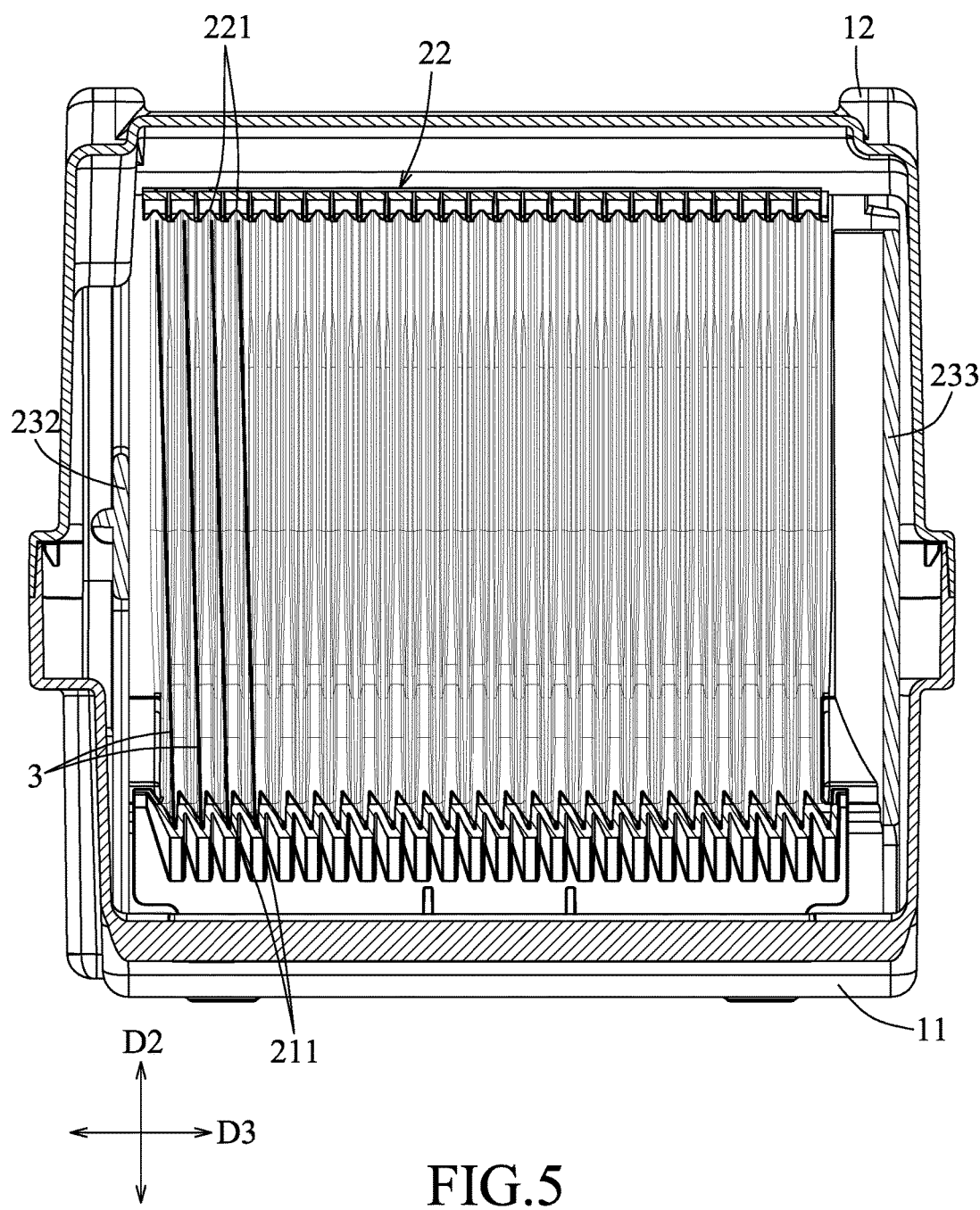
FIG. 5 is a sectional side view corresponding to FIG. 4.
Figure 6:
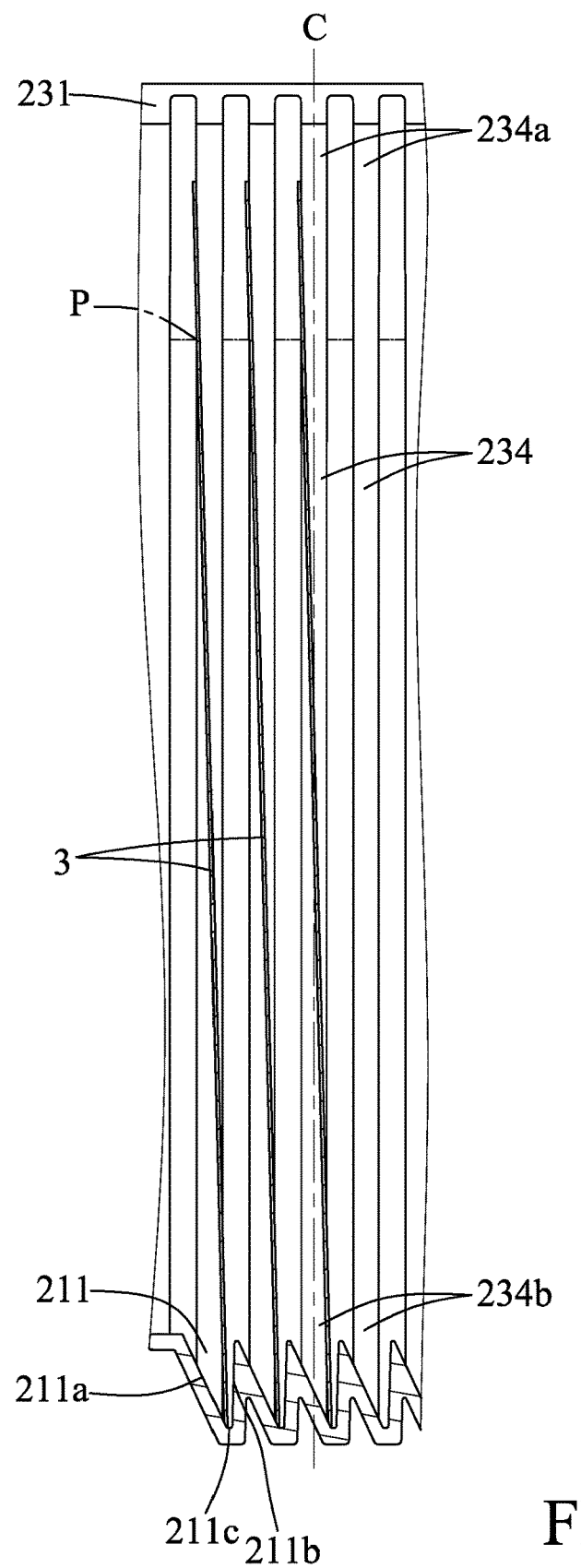
FIG. 6 is an enlarged fragmentary sectional side view illustrating positional relationship between wafers and a positioning unit of the embodiment.
Figure 7:
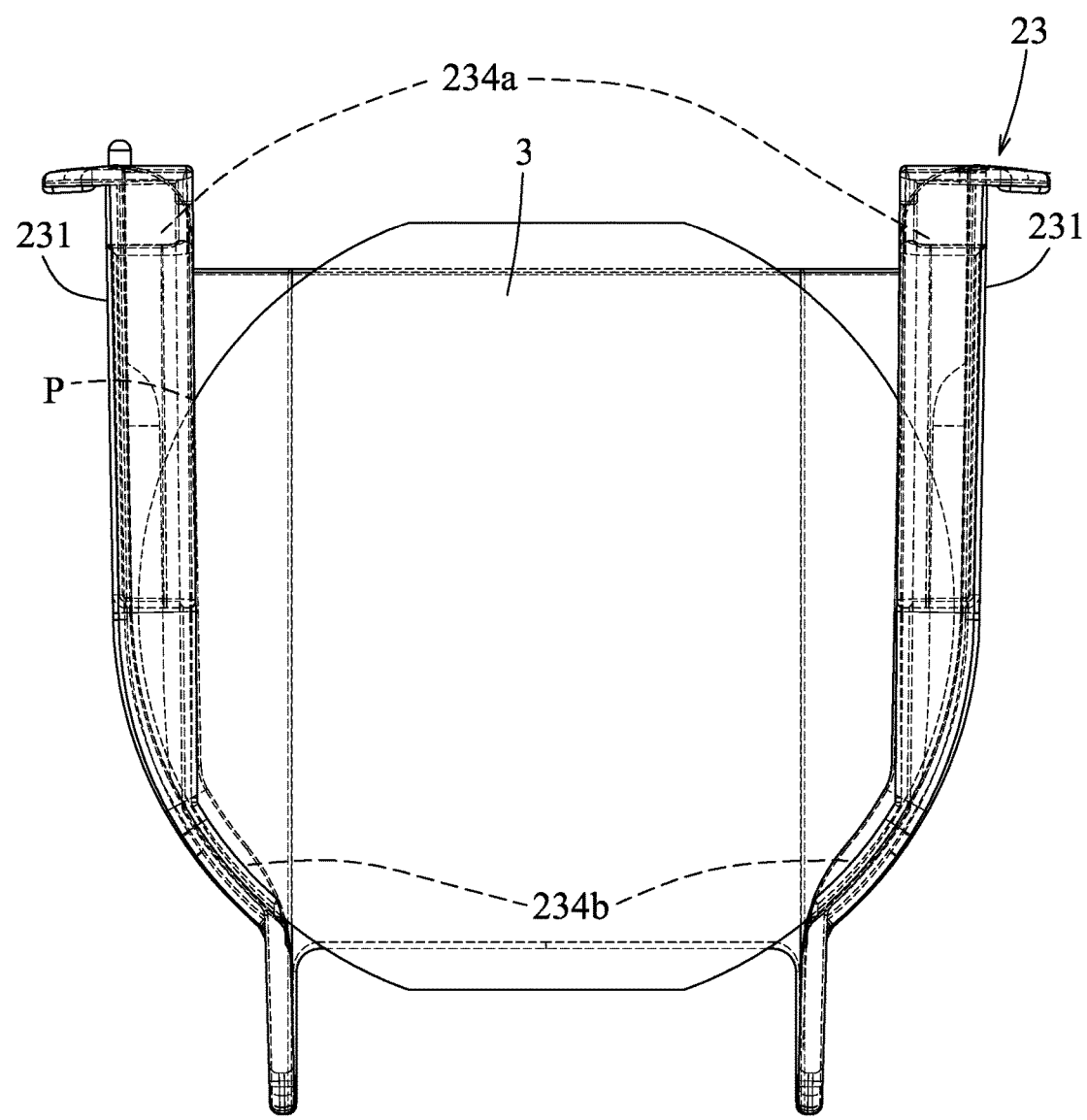
FIG. 7 is a schematic view illustrating positional relationship between wafers and a cassette of the embodiment.

Referring to FIGS. 5 to 7, each of the lower confining slots 211 is defined by two slot walls 211a, 211b that are interconnected at bottom ends thereof to form a slot bottom 211c and that have upper ends spaced apart from each other. Each of the lower confining slots 211 has a V-shaped cross section in a side view. The slot bottoms 211c of the lower confining slots 211 are respectively misaligned from central positions (C) of the lateral confining slots 234 of the holding walls 231 along the front-rear direction (D3), ensuring that the wafers 3 in the cassette 23 lean on the same direction to avoid contact with each other.

To be more specific, in this embodiment, in each two of the slot walls 211a, 211b defining one of the lower confining slots 211, the slot wall 211a, which is closer to the H-shaped front wall 232, is inclined with respect to the front-rear direction (D3), and the slot wall 211b, which is closer to the rear wall 233, is perpendicular to the front-rear direction (D3). As the slot wall 211b perpendicular to the front-rear direction (D3) is aligned with the rear side of the corresponding one of the lateral confining slots 234 of the holding walls 231 in the top-down direction (D2), the slot bottom 211c of each of the lower confining slots 211 is located behind the center position (C) of the corresponding one of the lateral confining slots 234 as well.

In such way, when each of the wafers 3 enters the corresponding one of the lower confining slots 211, the lower edge of the wafer 3 is guided by the inclined slot wall 211a to approach the perpendicular slot wall 211b in order to enter the slot bottom 211c, while the upper edge of the wafer 3 leans toward the front side of the corresponding lateral confining slot 234. Referring to FIG. 7, as the wafer 3 is circular, only a portion of a peripheral edge of the wafer 3 is confined within the corresponding lateral confining slot 234. The marked position (P) in FIG. 6 indicates the highest point in which the wafer 3 still has been confined within the corresponding lateral confining slot 234, and corresponds to the marked portion (P) in FIG. 7.

In another configuration of the embodiment, the slot bottom 211c of each of the lower confining slots 211 is located behind the rear side of the corresponding one of the lateral confining slots 234 of the holding walls 231 to force the wafers 3 to lean toward the front side of the lateral confining slots 234, to ensure that each of the wafers 3 keeps a proper distance with any one of its neighboring wafers 3.

In still another configuration of the embodiment, the slot bottom 211c of each of the lower confining slots 211 is located in front of the center position (C) of the corresponding one of the lateral confining slots 234 of the holding walls 231. To be more specific, in each two of the slot walls 211a, 211b defining one of the lower confining slots 211, the one of the slot walls 211a, 211b, which is closer to the H-shaped front wall 232, is perpendicular to the front-rear direction (D3), and the other one of the slot walls 211a, 211b, which is closer to the rear wall 233, is inclined with respect to the front-rear direction (D3), such that the slot bottom 211c is located in front of the center position (C) of the corresponding one of the lateral confining slots 234. The slot bottom 211c may be aligned in the top-down direction with, or be located in front of, the front side of the corresponding one of the lateral confining slots 234 to lean the wafers 3 toward the rear side. Any configuration that ensures proper spacing between the wafers 3 would suffice, and is not restricted to the above configuration.

Referring back to FIGS. 2 to 4, as the shape of the lower confining slots 211 is not symmetrical in the front-rear direction (D3), the through groove 212a and the first protrusion member 111 may have asymmetrical design in the front-rear direction (D3) as well to prevent mounting of the lower retaining member 21 in a wrong orientation. Designing each of the positioning notches 212b and each of the resilient hook 112 to be different size may also alleviate the above issue as well, and is not restricted to the above configurations.

In summary, by allowing the slot bottoms 211*c* of the lower confining slots 211 to be respectively misaligned from central position (C) of the lateral confining slots 234 of each of the holding walls 231 along the front-rear direction (D3), the wafers 3 in the cassette 23 may lean in same direction, ensuring proper spacing between the wafers 3.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A wafer shipping box comprising:
   a case including a base, a cover detachably connected to said base, and a receiving space defined by said base and said cover; and
   a positioning unit disposed in said receiving space, and including a lower retaining member that is connected to said base, an upper retaining member that is connected to said cover, and a cassette that is disposed between said upper and lower retaining members,
   wherein said cassette includes two upright holding walls that are spaced apart in a left-right direction and opposite to each other, each of said holding walls having a plurality of lateral confining slots aligned in a front-rear direction, each of said lateral confining slots extending in a top-down direction and having a top end opening and a bottom end opening, said upper retaining member being formed with a plurality of upper confining slots that respectively correspond in position to said lateral confining slots of said holding walls, said lower retaining member being formed with a plurality of lower confining slots that respectively correspond in position to said lateral confining slots of said holding walls, each of said lower confining slots being defined by two slot walls that are interconnected at bottom ends thereof to form a slot bottom, and that have upper ends spaced apart from each other, said slot bottoms of said lower confining slots being respectively misaligned from central positions of said lateral confining slots of said holding walls along the front-rear direction.

2. The wafer shipping box as claimed in claim 1, wherein, in each two of said slot walls defining a corresponding one of said lower confining slots, one is perpendicular to the front-rear direction, and the other one is inclined with respect to the front-rear direction.

3. The wafer shipping box as claimed in claim 2, wherein said lower retaining member includes a base portion, and two supporting portions that are respectively connected to opposite sides of said base portion in the left-right direction and that are inclined upwardly away from each other, wherein said lower confining slots are formed on top ends of said supporting portions of said lower retaining member.

4. The wafer shipping box as claimed in claim 1, wherein said cassette further includes an H-shaped front wall connected to front ends of said holding walls, and a rear wall connected to rear ends of said holding walls.

5. The wafer shipping box as claimed in claim 4, wherein said slot bottom of each of said lower confining slots is located behind said center position of a corresponding one of said lateral confining slots of said holding walls.

6. The wafer shipping box as claimed in claim 5, wherein said slot bottom of each of said lower confining slots is aligned with a rear side of the corresponding one of said lateral confining slots of said holding walls in the top-down direction.

7. The wafer shipping box as claimed in claim 5, wherein said slot bottom of each of said lower confining slots is located behind a rear side of the corresponding one of said lateral confining slots of said holding walls.

8. The wafer shipping box as claimed in claim 5, wherein, in each two of said slot walls defining a corresponding one of said lower confining slots, the one closer to said H-shaped front wall is inclined with respect to the front-rear direction, and the other one closer to said rear wall is perpendicular to the front-rear direction.

9. The wafer shipping box as claimed in claim 6, wherein, in each two of said slot walls defining a corresponding one of said lower confining slots, the one closer to said H-shaped front wall is inclined with respect to the front-rear direction, and the other one closer to said rear wall is perpendicular to the front-rear direction.

10. The wafer shipping box as claimed in claim 7, wherein, in each two of said slot walls defining a corresponding one of said lower confining slots, the one closer to said H-shaped front wall is inclined with respect to the front-rear direction, and the other one closer to said rear wall is perpendicular to the front-rear direction.

11. The wafer shipping box as claimed in claim 4, wherein said slot bottom of each of said lower confining slots is located in front of said center position of the corresponding one of said lateral confining slots of said holding walls.

12. The wafer shipping box as claimed in claim 11, wherein said slot bottom of each of said lower confining slots is aligned with a front side of the corresponding one of said lateral confining slots of said holding walls in the top-down direction.

13. The wafer shipping box as claimed in claim 11, wherein said slot bottom of each of said lower confining slots is located in front of a front side of the corresponding one of said lateral confining slots of said holding walls in the top-down direction.

14. The wafer shipping box as claimed in claim 11, wherein, in each two of said slot walls defining a corresponding one of said lower confining slots, the one closer to said H-shaped front wall is perpendicular to the front-rear direction, and the other one closer to said rear wall is inclined with respect to the front-rear direction.

15. The wafer shipping box as claimed in claim 12, wherein, in each two of said slot walls defining a corresponding one of said lower confining slots, the one closer to said H-shaped front wall is perpendicular to the front-rear direction, and the other one closer to said rear wall is inclined with respect to the front-rear direction.

16. The wafer shipping box as claimed in claim 13, wherein, in each two of said slot walls defining a corresponding one of said lower confining slots, the one closer to said H-shaped front wall is perpendicular to the front-rear direction, and the other one closer to said rear wall is inclined with respect to the front-rear direction.

17. The wafer shipping box as claimed in claim 1, wherein said upper retaining member and said cover are formed as one piece.

* * * * *